(12) United States Patent
Frohberg et al.

(10) Patent No.: US 8,492,217 B2
(45) Date of Patent: Jul. 23, 2013

(54) METHODS OF FORMING CONDUCTIVE CONTACTS WITH REDUCED DIMENSIONS

(75) Inventors: Kai Frohberg, Niederau (DE); Dominik Olligs, Dresden (DE); Daniel Prochnow, Dresden (DE); Katrin Reiche, Goltzscha (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 43 days.

(21) Appl. No.: 13/237,011

(22) Filed: Sep. 20, 2011

(65) Prior Publication Data

US 2013/0072016 A1   Mar. 21, 2013

(51) Int. Cl.
  *H01L 21/8238* (2006.01)
(52) U.S. Cl.
  USPC ............ 438/199; 438/197; 257/E21.214
(58) Field of Classification Search
  USPC ............ 438/199, 197, 287, 692, 216, 200, 438/218, 702, 637; 257/369, E21.159, E21.214, 257/E21.616
  See application file for complete search history.

(56) References Cited

U.S. PATENT DOCUMENTS

| | | | |
|---|---|---|---|
| 6,372,616 B1* | 4/2002 | Yoo et al. | 438/592 |
| 7,759,185 B2* | 7/2010 | Nam et al. | 438/199 |
| 2004/0026788 A1* | 2/2004 | Kim | 257/774 |
| 2008/0272436 A1* | 11/2008 | Nam et al. | 257/368 |

* cited by examiner

*Primary Examiner* — Telly Green
(74) *Attorney, Agent, or Firm* — Williams, Morgan & Amerson, P.C.

(57) ABSTRACT

Disclosed herein are various methods of forming conductive contacts with reduced dimensions and various semiconductor devices incorporating such conductive contacts. In one example, one method disclosed herein includes forming a layer of insulating material above a semiconducting substrate, wherein the layer of material has a first thickness, forming a plurality of contact openings in the layer of material having the first thickness and forming an organic material in at least a portion of each of the contact openings. This illustrative method further includes the steps of, after forming the organic material, performing an etching process to reduce the first thickness of the layer of insulating material to a second thickness that is less than the first thickness, after performing the etching process, removing the organic material from the contact openings and forming a conductive contact in each of the contact openings.

11 Claims, 9 Drawing Sheets

METHODS OF FORMING CONDUCTIVE CONTACTS WITH REDUCED DIMENSIONS

BACKGROUND OF THE INVENTION

1. Field of the Invention

Generally, the present disclosure relates to the manufacturing of sophisticated semiconductor devices, and, more specifically, to various methods of forming conductive contacts with reduced dimensions and various semiconductor devices incorporating such conductive contacts.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein field effect transistors (NMOS and PMOS transistors) represent one important type of circuit elements that substantially determine performance of the integrated circuits. During the fabrication of complex integrated circuits using, for instance, MOS technology, millions of transistors, e.g., NMOS transistors and/or PMOS transistors are formed on a substrate including a crystalline semiconductor layer. A field effect transistor, irrespective of whether an NMOS transistor or a PMOS transistor is considered, typically comprises so-called PN junctions that are formed by an interface of highly doped regions, referred to as drain and source regions, with a slightly doped or non-doped region, such as a channel region, disposed between the highly doped source/drain regions. The channel length of a MOS transistor is generally considered to be the lateral distance between the source/drain regions.

In a field effect transistor, the conductivity of the channel region, i.e., the drive current capability of the conductive channel is controlled by a gate electrode formed adjacent to the channel region and separated therefrom by a thin gate insulation layer. The conductivity of the channel region depends upon, among other things, the dopant concentration, the mobility of the charge carriers and the channel length of the transistor. Thus, in modern ultra-high density integrated circuits, device features, like the channel length, have been steadily decreased in size to enhance the performance of the semiconductor device and the overall functionality of the circuit. For example, current day MOS transistors may have a channel length that ranges from 32-44 nm, depending upon the device under construction. The gate pitch on current-day devices may be on the order of 120-130 nm.

However, the ongoing shrinkage of feature sizes on transistor devices causes certain problems that may at least partially offset the advantages that may be obtained by such shrinkage of the device features. For example, decreasing the channel length on MOS transistors may enhance the performance characteristics of such devices, such as increasing the drive current capabilities and enhancing the switching speeds of the MOS transistors. However, the corresponding reduction in the gate pitch between adjacent transistors limits the available space between adjacent gate electrode structures (more precisely between adjacent sidewall spacers) in which to place or locate conductive contact elements—e.g., the conductive elements that provide electrical connection to the transistor, such as contact vias and the like. Such limited spacing mandates that the conductive contacts be very small physically. Accordingly, the increased electrical resistance associated with such very small conductive contact elements may become a significant issue in the overall transistor design, and such increased may have an adverse impact on the overall performance of the associated circuit elements.

Figure 1:
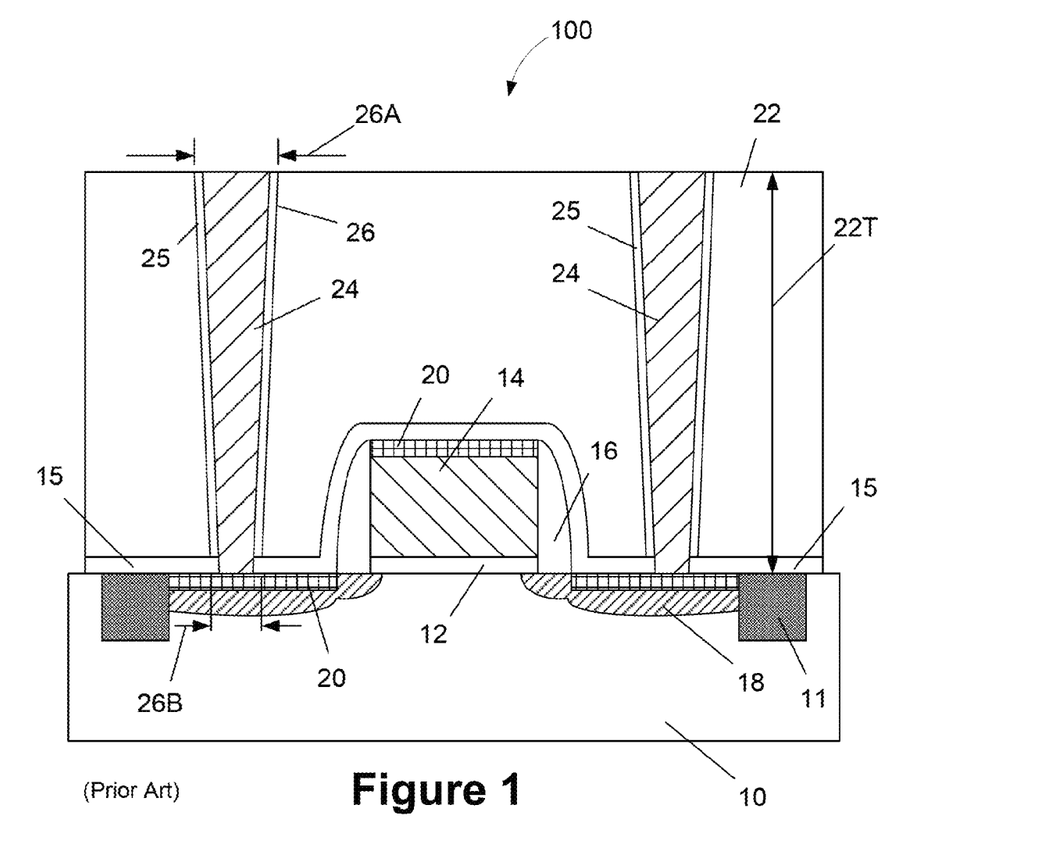
FIG. 1 depicts one illustrative prior art semiconductor device with conductive contacts formed thereon.

FIG. 1 schematically depicts an illustrative prior art transistor 100 that is formed in and above a semiconducting substrate 10 in an active area defined by a shallow trench isolation structure 11. At the point of fabrication depicted in FIG. 1, the transistor 100 includes a gate insulation layer 12, a gate electrode 14, sidewall spacers 16, a plurality of source/drain regions 18 formed in the substrate 10 and a plurality of illustrative metal silicide regions 20. Also depicted in FIG. 1 is an etch stop layer 15, a layer of insulating material 22, a so-called shrink liner 25 and a plurality of schematically depicted conductive contacts 24 formed in contact openings 26 formed in the layer of insulating material 22. So as not to over-complicate the drawing, one or more barrier layers typically formed when forming the conductive contacts 24 are not depicted in FIG. 1. It should be noted that the size of the conductive contacts 24 and the spacing between such contacts 24 and the gate structure of the transistor 100 are not to scale.

The various components and structures of the device 100 may be formed using a variety of different materials and by performing a variety of known techniques. For example, the gate insulation layer 12, the shrink liner 25 and the layer of insulating material 22 may be comprised of silicon dioxide; the gate electrode 14 may be comprised of polysilicon; and the sidewall spacers 16 and the etch stop layer 15 may be comprised of silicon nitride. In some cases, the gate electrode 14 may be comprised of a metal. In such a case, the metal silicide region 20 depicted on the gate electrode 14 would not be present. The source/drain regions 18 may be comprised of implanted dopant materials (N-type dopants for NMOS devices and P-type dopant for PMOS devices) that are implanted into the substrate 10 using known masking and ion implantation techniques. The metal silicide regions 20 are formed in the source/drain regions 18, and they are provided to reduce the resistance between the conductive contacts 24 and the source/drain regions 18. The metal silicide regions 20 depicted herein may be made using a variety of different refractory metals, e.g., nickel, platinum, cobalt, etc., or combinations thereof, and they may be formed using techniques that are well known to those skilled in the art. The typical steps performed to form metal silicide regions are: (1) depositing a layer of refractory metal; (2) performing an initial heating process causing the refractory metal to react with underlying silicon containing material; (3) performing an etching process to remove unreacted portions of the layer of refractory metal and (4) performing an additional heating process to form the final phase of the metal silicide. Of course, those skilled in the art will recognize that there are other features of the transistor 100 that are not depicted in the drawings for purposes of clarity. For example, so called halo implant regions are not depicted in the drawings as well as various layers or regions of silicon germanium that are typically found in high-performance PMOS transistors.

The transistor 100 may be formed using traditional techniques and processes. For example, after the layer of insulating material 22 is deposited above the etch stop layer 15, an etching process is performed through a patterned mask layer (not shown), e.g., a photoresist mask, that is formed above the layer of insulating material 22. This etching process defines the contact openings 26. Thereafter, the shrink liner 25 is formed in the openings 26 and above the layer of insulating material 22 by performing a conformal deposition process. The purpose of the shrink liner 25 is to effectively reduce the lateral dimensions of the contact openings 26. An anisotropic etching process is then performed to remove the shrink liner 25 from above the etch stop layer 15 at the bottom of the opening 26. Another etching process is then performed to remove the exposed portions of the etch stop layer 15 at the bottom of the openings 26 to thereby expose the metal silicide regions 20. Thereafter, one or more barrier layers (not shown) are formed in the opening 26 and a conductive material is deposited in the opening 26. A chemical mechanical planarization process (CMP) process may then be performed to remove excess materials position outside of the opening 26 and to planarize the upper surface of the layer of insulating material 22. These process operations result in the formation of the schematically depicted conductive contacts 24.

In one illustrative embodiment, the layer of insulating material 22 for such a prior art transistor may have a thickness 22T that is about 240 nm. In one illustrative embodiment, the diameter of the contact openings 26 at the top 26A may be of about 37 nm while the diameter of the contact opening 26 may be about 35 nm at the bottom 26B of the opening 26. The contact opening 26 for such a prior art device 100 may typically have an aspect ratio that ranges from about 5-7.

As noted above, the contact openings 26 are typically formed by forming a patterned mask layer, e.g., a photoresist mask, above the layer of insulating material 22 and thereafter performing an etching process to define the contact openings 26. That is, the critical dimension of the contact openings 26, e.g., the diameter of the openings 26 is subject to the limitations of known photolithography techniques and tools to be able to produce a mask layer with the desired final critical dimension of the contact opening 26. However, several optical restrictions limit the ability of existing photolithography tools to produce the conductive contacts 24 having the desired final, very-small critical dimensions. As a result, conductive contacts 24 made using the prior art techniques described above tend to be larger than would otherwise be desirable. For example, the illustrative conductive contacts 24 described above may have a diameter at the top of the contact 24 of about 40 nm and a diameter at the bottom of the contact of about 30 nm. Such relatively large conductive contacts 24 are difficult to position in the limited space available for such contact on modern devices. Moreover, such larger contacts can lead to problems such as unintended electrical shorting between adjacent conductive contacts 24 and/or between a conductive contact 24 and the gate electrode 14. Such electrical shorts can impair device functionality and, in a worst case scenario, result in the loss of the functionality of an electrical circuit incorporating the shorted device 100.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive contacts with reduced dimensions and various semiconductor devices incorporating such conductive contacts. In one example, the method includes the steps of forming a layer of insulating material above a semiconducting substrate, wherein the layer of material has a first thickness, forming a plurality of contact openings in the layer of material having the first thickness and forming an organic material in at least a portion of each of the contact openings. This illustrative method further includes the steps of, after forming the organic material, performing an etching process to reduce the first thickness of the layer of insulating material to a second thickness that is less than the first thickness, after performing the etching process, removing the organic material from the contact openings and forming a conductive contact in each of the contact openings.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive contacts with reduced dimensions and various semiconductor devices incorporating such conductive contacts. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, etc. With reference to FIGS. 2A-2E, various illustrative embodiments of the methods disclosed herein will now be described in more detail. To the extent that FIGS. 2A-2E use the same reference numbers that have previously been used in connection with FIG. 1 to describe various structures and regions, those same descriptions apply equally with respect to the corresponding structures and features depicted in FIGS. 2A-2E.

Figure 2A:
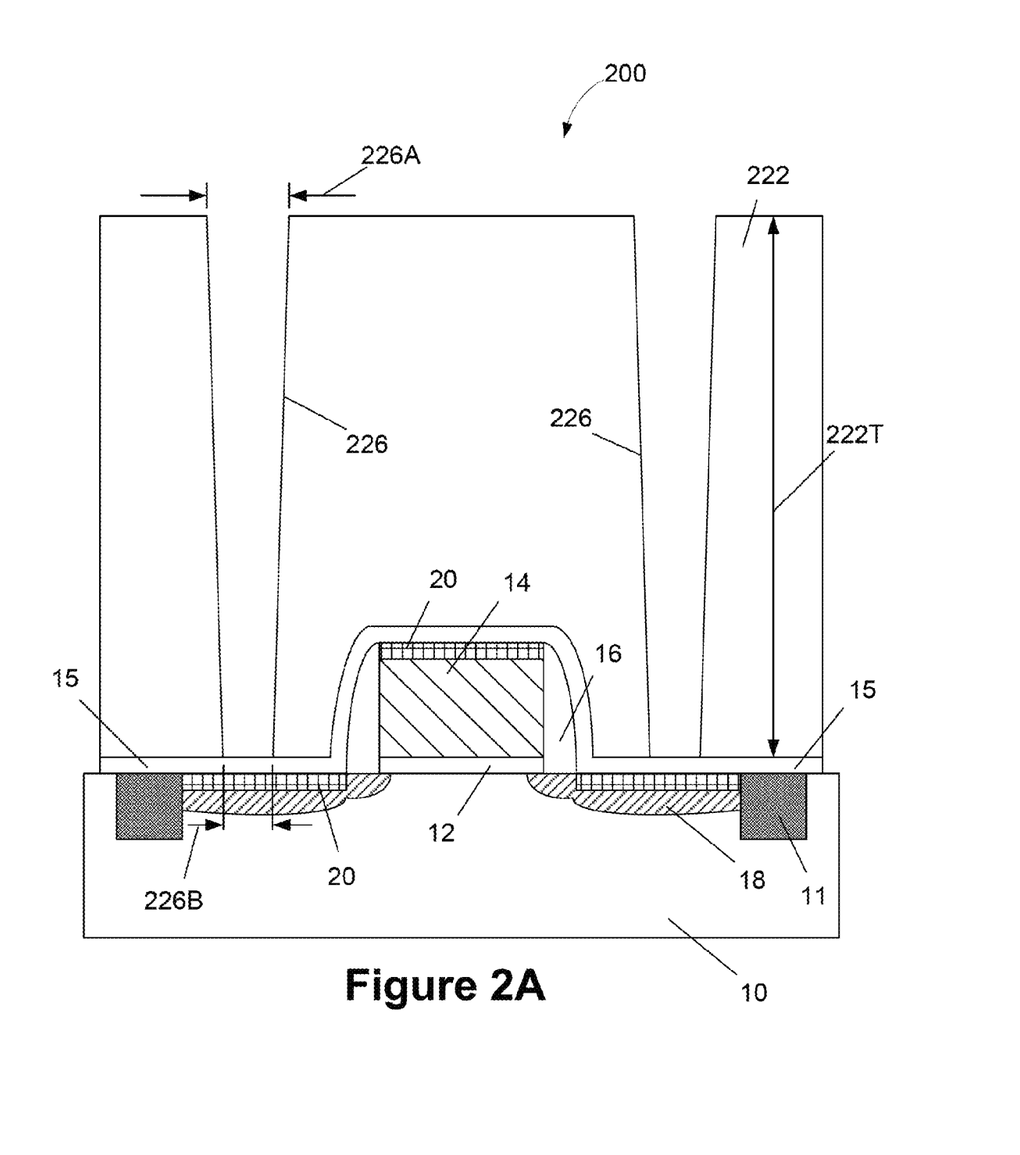
FIGS. 2A-2E depict one illustrative process flow for forming conductive contacts with reduced dimensions as disclosed herein.
Figure 2B:
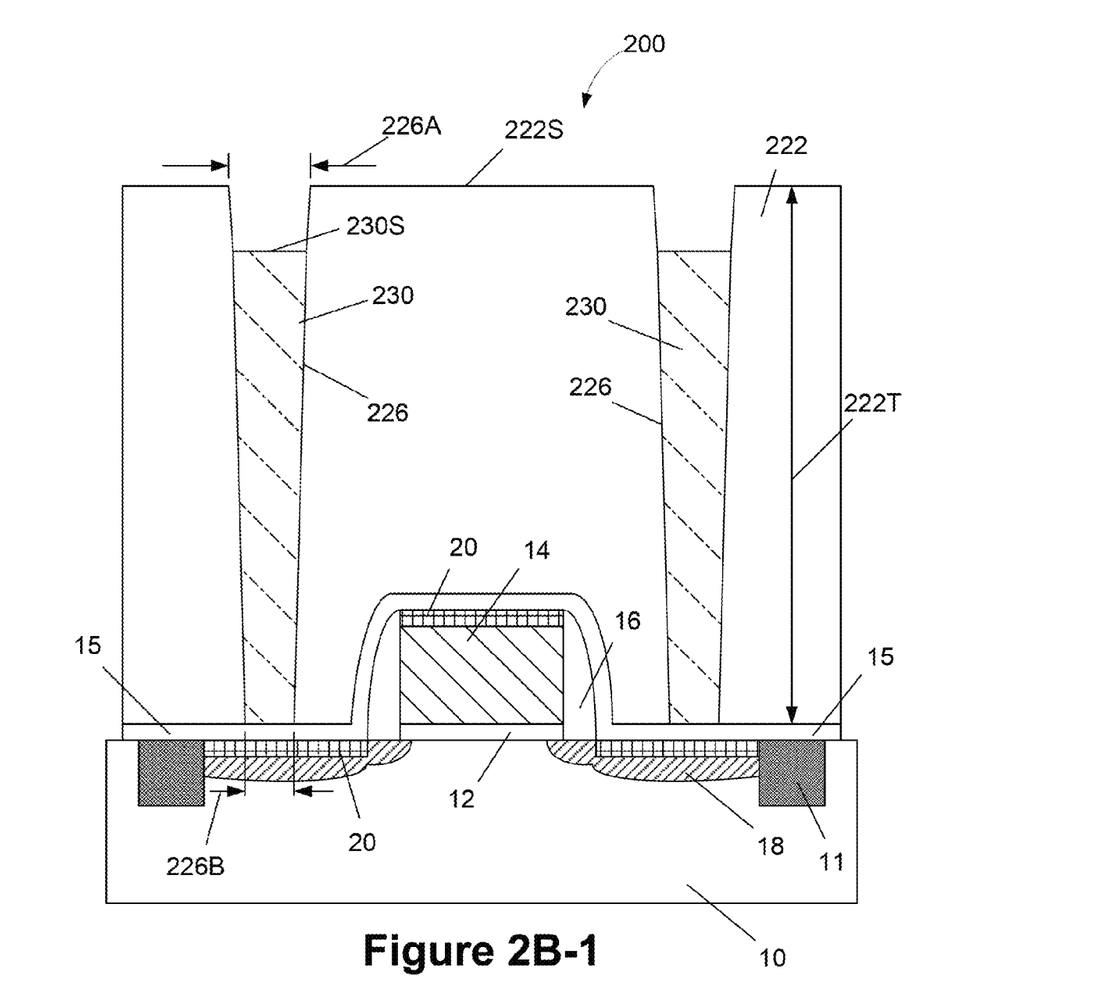
Figure 2B:
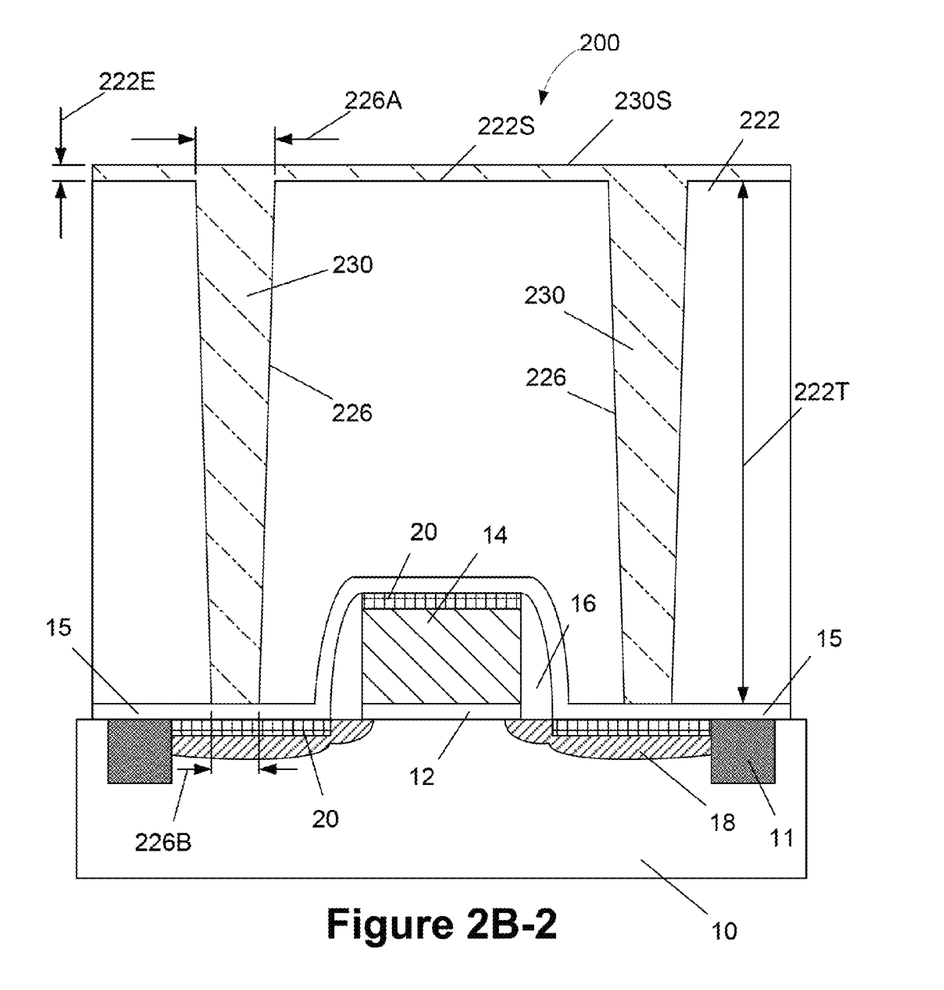
Figure 2C:
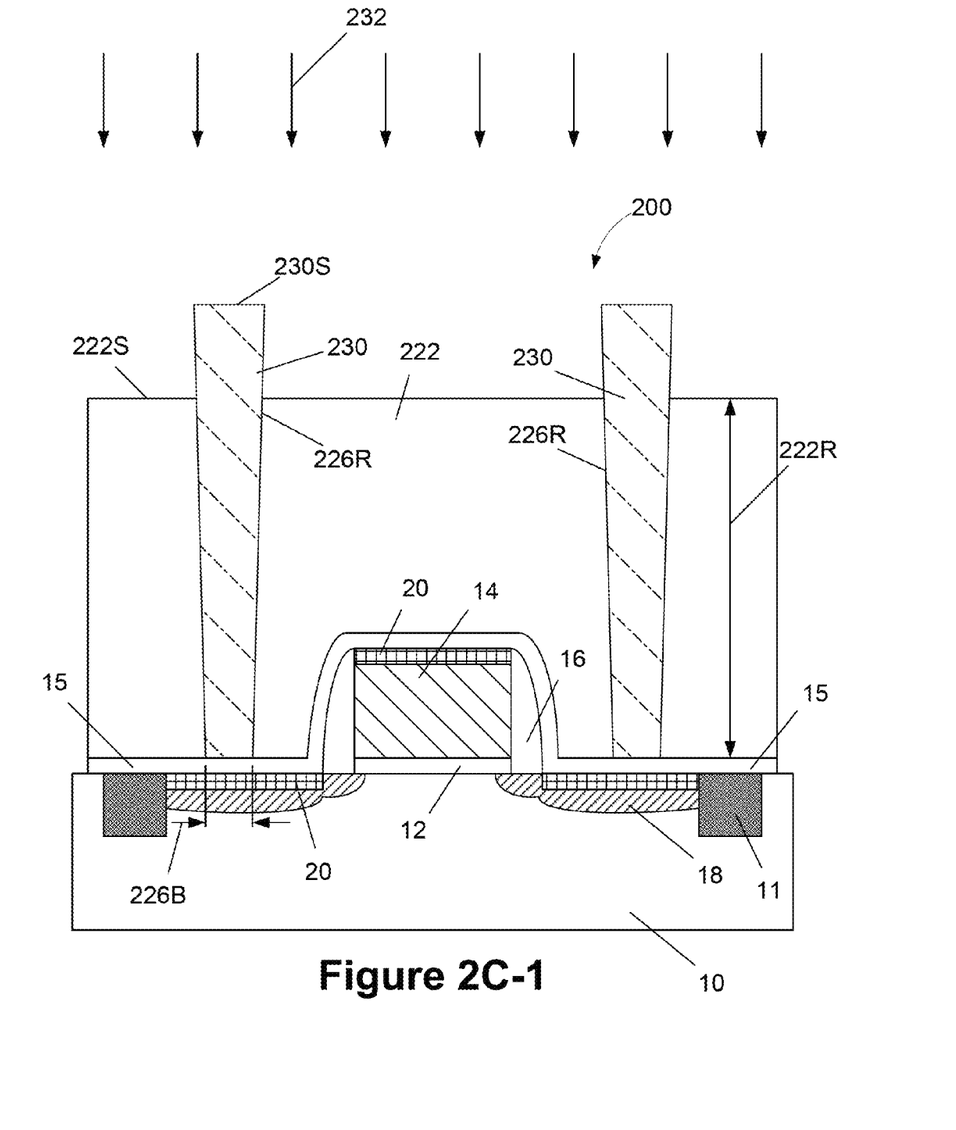
Figure 2C:
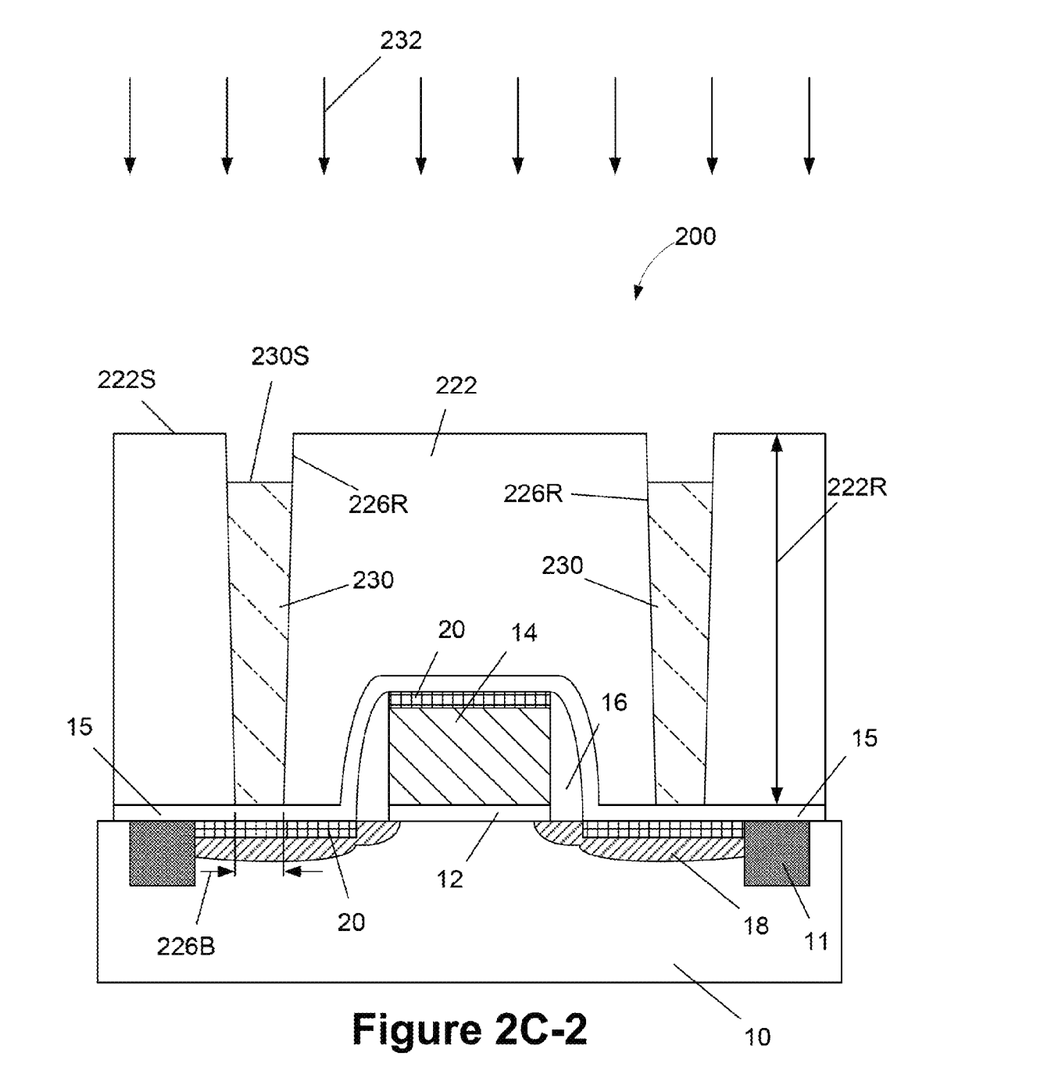

FIG. 2A is a simplified view of an illustrative semiconductor device 200 at an early stage of manufacturing that is formed above a semiconducting substrate 10. At the point of fabrication depicted in FIG. 2A, the transistor 200 includes a gate insulation layer 12, a gate electrode 14, an etch stop layer 15, sidewall spacers 16, a plurality of source/drain regions 18 and a plurality of illustrative metal silicide regions 20. Also depicted in FIG. 2A is a layer of insulating material 222, having a thickness 222T, with a plurality of contact openings 226 formed therein. It should be noted that the size of the contact openings 226 and the spacing between such contact openings 226 and the gate structure of the transistor 200 are not to scale. The substrate 10 may have a variety of configurations, such as the depicted bulk silicon configuration. The substrate 10 may also have a silicon-on-insulator (SOI) configuration that includes a bulk silicon layer, a buried insulation layer and an active layer, wherein semiconductor devices are formed in and above the active layer. Thus, the terms substrate or semiconductor substrate should be understood to cover all forms of semiconductor structures. The substrate 10 may also be made of materials other than silicon.

The various components and structures of the device 200 may be formed using a variety of different materials and by performing a variety of known techniques. For example, the gate insulation layer 12 may be comprised of a variety of different insulating materials, e.g., silicon dioxide, a so-called high-k insulating material (k value greater than 10). The gate electrode 14 may be comprised of polysilicon or it may contain at least one metal layer. In the case where the gate electrode 14 is comprised of a metal, the metal silicide region 20 depicted on the gate electrode 14 would not be present. The gate structure of the transistor 200 may be made using so-called "gate first" or "gate last" techniques. For purposes of this disclosure, it will be assumed that the gate electrode 14 is made of polysilicon, however such an illustrative embodiment should not be considered as a limitation of the present invention. The sidewall spacers 16 and the etch stop layer 15 may be comprised of a variety of materials, such as silicon nitride, that may be selectively etched relative to the layer of insulating material 222. The source/drain regions 18 may be comprised of implanted dopant materials (N-type dopants for NMOS devices and P-type dopant for PMOS devices) that are implanted into the substrate 10 using known masking and ion implantation techniques.

In contrast to the prior art device 100 depicted in FIG. 1, in one illustrative embodiment, the layer of insulating material 222 is initially formed such that it has a thickness 222T that is significantly thicker than the thickness 22T of the layer of insulating material 22. For example, in one illustrative embodiment, the thickness 222T of the layer of insulating material 222 may range from about 270-350 nm. The layer of insulating material 222 may be comprise of a variety of insulating materials, such as, silicon dioxide, a low-k dielectric (k value less than 3), etc. The layer of insulating material 222 may be formed by performing a variety of techniques, such as a chemical vapor deposition (CVD), atomic layer deposition (ALD), or plasma enhanced versions of such processes. In one illustrative embodiment, the layer of insulating material 222 is a layer of silicon dioxide having a thickness of about 270-350 nm that is initially formed by performing a CVD process.

After the layer of material 222 is formed, the contact openings 226 are formed by performing an etching process through a patterned mask layer (not shown), e.g., a photoresist mask, positioned above the layer of insulating material 222. In one illustrative embodiment, the etching process may be an anisotropic etching process, such as a dry reactive ion etching process. The etching process stops on the etch stop layer 15. Although an anisotropic etching process is performed to define the contact openings 226, the size, e.g., diameter, of the contact openings 226 tends to decrease as the etching process progresses, as depicted in FIG. 2A. In one illustrative embodiment, the diameter 226A of the contact openings 226 at the top may be of about 37-40 nm while the diameter 226B of the contact opening 226 at the bottom of the openings 226 may be about 25 nm. Due to the extra thickness 222T of the layer of insulating material 222 when the contact openings 226 are formed, the size, e.g., diameter 226B at the bottom of the contact opening is significantly smaller than the size at the bottom of the prior art contact opening 26 depicted in FIG. 1. The contact openings 226 have an axial length that generally corresponds to the thickness 222T of the layer of insulating material 222. In contrast to the contact openings 26 for the prior art device 100, the contact openings 226 for the device 200 depicted in FIG. 2 typically have a larger aspect ratio, e.g., an aspect ratio that ranges from about 7-10, due to the additional thickness of the layer of insulating material 222 as compared to the thickness 22 of the layer of insulating material 22 for the prior art device 100. It should be noted that the present invention will be disclosed in the illustrative context where the contact openings 226 (and eventually the conductive contacts formed therein) have a substantially cylindrical configuration (round when viewed from above) and they contact the underlying transistor device. However, as will be recognized by those skilled in the art after a complete reading of the present application, the present invention may be applied in forming conductive contacts having any configuration and they may be formed at any level of an integrated circuit device, it is not required that such conductive contacts physically contact the underlying device. Thus, the illustrative examples depicted herein should not be considered a limitation of the present inventions.

Next, as shown in FIGS. 2B-1 and 2B-2, a material 230 is formed in the openings 226 and may or may not overfill the openings 226. For example, in some embodiments, after the material 230 is formed in the openings 226, the upper surface 230S of the material 230 may be below the upper surface 222S of the layer of insulating material 222 such that the material 230 underfills the openings 226 as shown in FIG. 2B-1. In other embodiments, the material 230 may be formed in the openings 226 so that the upper surface 230S of the material 230 is above the upper surface 222S of the layer of insulating material and the material 230 overfills the openings 226 as shown in FIG. 2B-2. If the material 230 overfills the openings 226, a light CMP process may be performed to remove the excess material 230E of the material 230 that is positioned outside of the openings 226 and/or above the upper surface 222S of the layer of insulating material 222. In one illustrative embodiment, the material 230 may be comprised of a material that may be selectively etchable (to at least some degree) relative to the material of the layer of insulating material 222. In one illustrative embodiment, the material 230 may be an organic material, carbon, etc. The material 230 may be formed by performing a variety of known techniques, e.g., by performing a spin-coating process.

Thereafter, as shown in FIGS. 2C-1 and 2C-2, the overall thickness of the layer of material 222 is reduced to a thickness 222R by performing an etching process, such as dry reactive ion etching (RIE) process, as schematically depicted by the arrows 232. During the etching process 232, the material 230 in the openings 226 protects the underlying etch stop layer 15 and the metal silicide regions 20. In one illustrative embodiment, the thickness 222R of the layer of material 222 may be reduced to about 240 nm, such that the reduced length contact openings 226R have an aspect ratio that ranges from about 4-6. This etching process has the effect of reducing the axial length of the originally formed contact openings 226. Note that during the etching process 232, some of the material 230 may be consumed. However, in some cases, the thickness 222R of the layer of insulating material 222 may be reduced such that an upper surface 222S of the layer of insulating material 222 may be below the upper surface 230S of the material 230, as depicted in FIG. 2C-1. In other cases, such as is illustrated in the exemplary embodiment shown in FIG. 2C-2, the upper surface 230S of the material 230 may be below the upper surface 222S of the layer of insulating material 222 after the etching process 232 has been performed to reduce the overall thickness of the layer of insulating material 222.

Figure 2D:
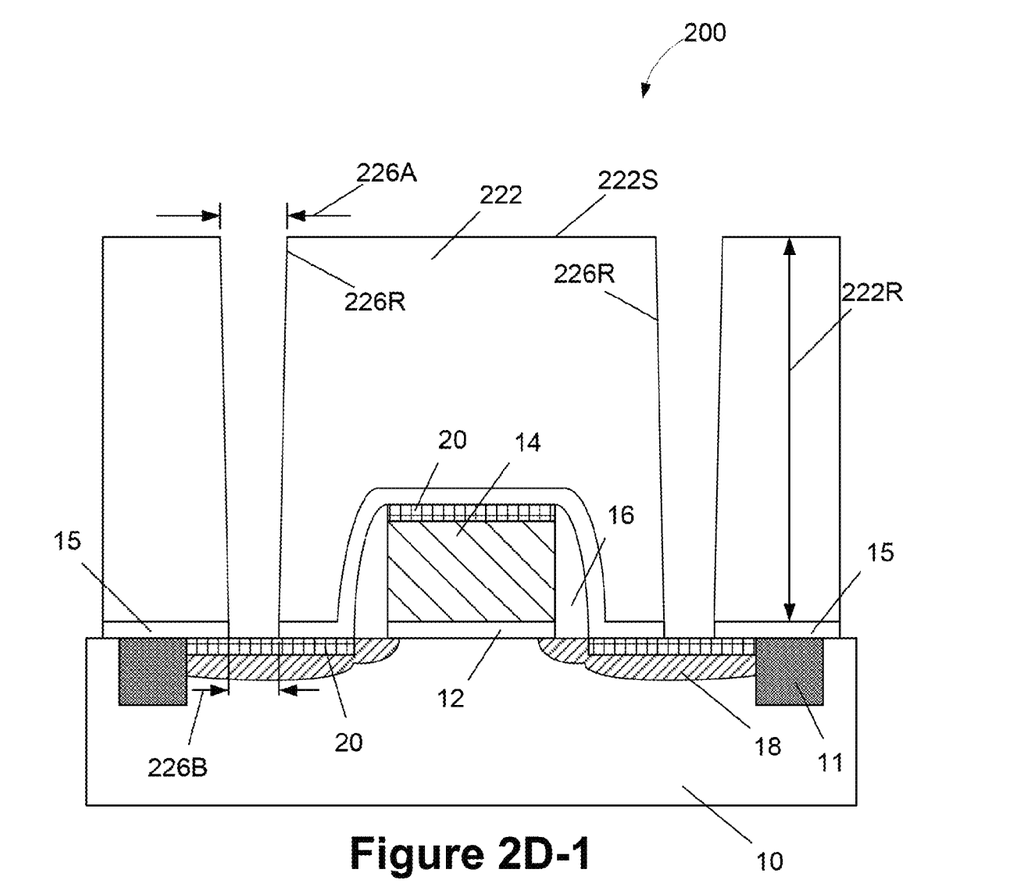
Figure 2D:
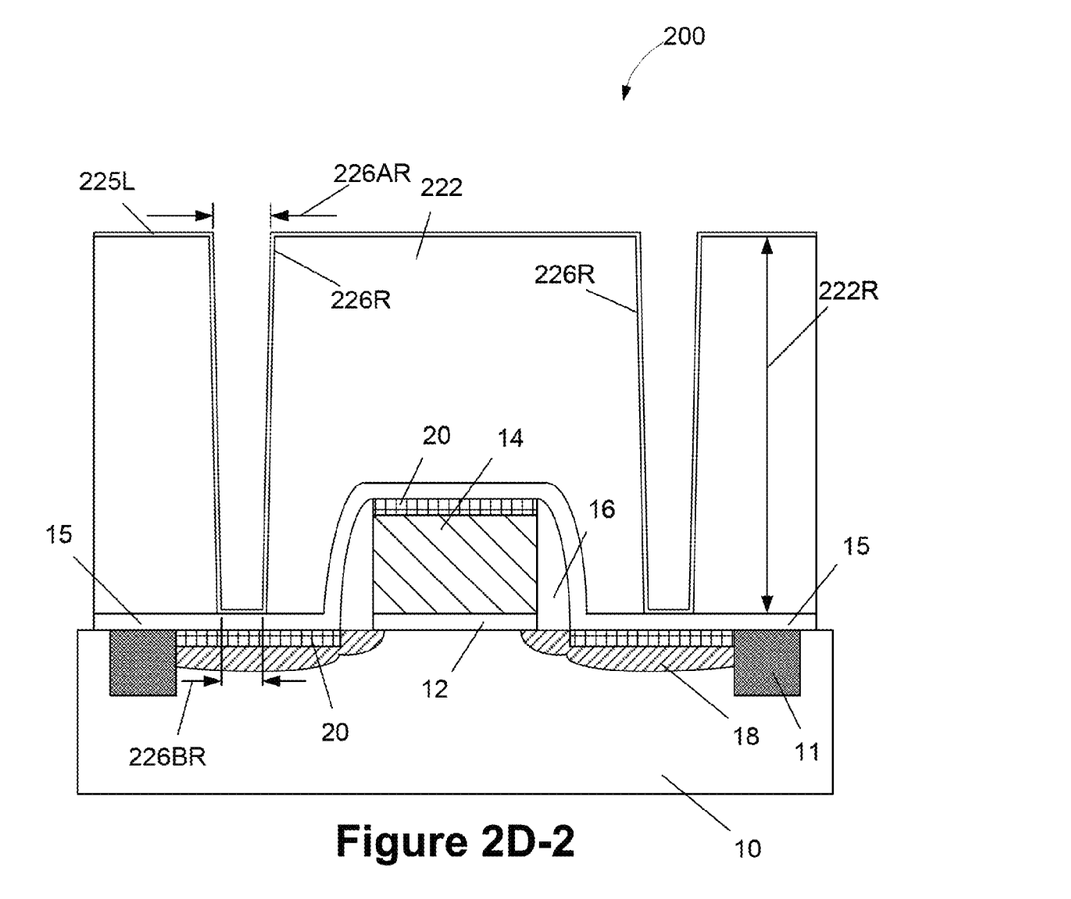

Thereafter, as shown in FIG. 2D-1, the material 230 is removed from the reduced length openings 226R. The material 230 may be removed by any of a variety of techniques depending upon the exact materials used, e.g., by performing a plasma strip process or by performing a solvent-based stripping process, etc. Then, after the material 230 is removed, an etching process, such as dry reactive ion etching (RIE) process, is performed to remove the exposed portions of the etch stop layer 15 at the bottom of the opening 226R to thereby expose the underlying metal silicide regions 20.

Thereafter, as shown in FIG. 2D, the material 230 is removed from the reduced length openings 226R. The material 230 may be removed by any of a variety of techniques depending upon the exact materials used, e.g., by performing a plasma strip process or by performing a solvent-based stripping process, etc. Then, after the material 230 is removed, an etching process, such as dry reactive ion etching (RIE) process, is performed to remove the exposed portions of the etch stop layer 15 at the bottom of the opening 226R to thereby expose the underlying metal silicide regions 20.

Figure 2E:
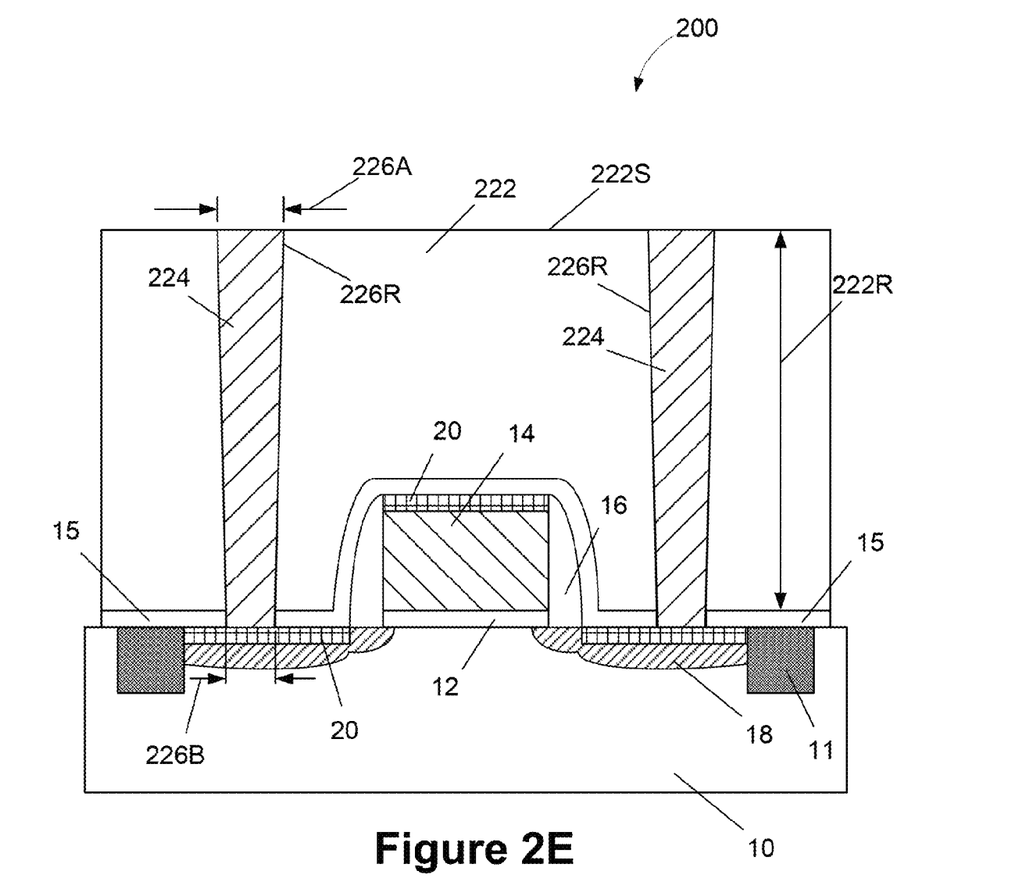

Thereafter, as shown in FIG. 2E, schematically depicted conductive contacts 224 are formed in the contact openings 226R using traditional techniques. More specifically, the formation of the conductive contacts 224 typically involves the formation of one or more barrier layers (not shown) in the openings 226R followed by the bulk deposition of a layer of conductive material, e.g., Ti, TiN, tungsten, aluminum, etc., that overfills the openings 226R. A chemical mechanical planarization process (CMP) process may then be performed to remove excess materials positioned outside of the opening 226R and to planarize the upper surface 222S of the layer of insulating material 222. These process operations result in the formation of the schematically depicted conductive contacts 224.

In at least some illustrative embodiments a shrink liner layer may be formed in the reduced length openings 226R after the material 230 has been removed from the openings 226R, as shown in FIG. 2D-2. If employed, such a shrink liner may be comprised of silicon dioxide and it may be formed by performing a conformal deposition process. The purpose of such a shrink liner layer would be to further reduce the lateral dimensions of the reduced length contact openings 226R.

Using the novel techniques disclosed herein, the conductive contacts 224 have reduced lateral dimensions as compared to the prior art conductive contacts 24 discussed in the background section of this application. Accordingly, the presently disclosed invention may enable the formation of physically smaller conductive contacts 224 in the limited space available on modern semiconductor devices.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a layer of insulating material above a semiconducting substrate, said layer of insulating material having a first overall thickness;
   forming a plurality of contact openings in said layer of material having said first overall thickness;
   forming an organic material in at least a portion of each of said contact openings;
   after forming said organic material, performing an etching process to reduce an overall thickness of said layer of insulating material from said first overall thickness to a second overall thickness that is less than said first overall thickness;
   after performing said etching process, removing said organic material from said contact openings; and
   forming a conductive contact in each of said contact openings.

2. The method of claim 1, further comprising, after removing said organic material from said contact openings, forming a liner layer in said contact openings prior to forming said conductive contacts.

3. The method of claim 1, wherein forming said organic material in at least a portion of each of said contact openings comprises forming said organic material such that it overfills said contact openings.

4. The method of claim 1, wherein forming said organic material in at least a portion of each of said contact openings comprises forming said organic material such that it occupies less than the entirety of said contact openings.

5. The method of claim 1, wherein performing said etching process to reduce said overall thickness of said layer of insulating material from said first overall thickness to said second overall thickness comprises performing said etching process such that an upper surface of said layer of insulating material after the completion of said etching process is positioned below an upper surface of said organic material remaining in at least one of said contact openings.

6. The method of claim 1, wherein performing said etching process to reduce said overall thickness of said layer of insulating material from said first overall thickness to said second overall thickness comprises performing said etching process such that an upper surface of said layer of insulating material after the completion of said etching process is positioned above an upper surface of said organic material remaining in at least one of said contact openings.

7. The method of claim 1, wherein said contact openings in said layer of insulating material having said first overall thickness have an initial axial length and wherein the step of performing said etching process to reduce said overall thickness of said layer of insulating material from said first overall thickness to said second overall thickness comprises performing said etching process to reduce said overall thickness of said layer of insulating material from said first overall thickness and to reduce said axial length of said contact openings.

8. A method, comprising:
   forming a layer of insulating material above a semiconducting substrate, said layer of insulating material having an overall thickness;
   forming a plurality of contact openings in said layer of material having said overall thickness;
   forming an organic material such that it occupies less that the entirety of said contact openings;
   after forming said organic material, performing an etching process on an entire upper surface of said layer of insulating material to reduce said overall thickness thereof such that an entire upper surface of said layer of insulating material, after the completion of said etching process, is positioned above an upper surface of said organic material remaining in at least one of said contact openings;
   after performing said etching process, removing said organic material from said contact openings; and
   forming a conductive contact in each of said contact openings.

9. The method of claim 8, further comprising, after removing said organic material from said contact openings, forming a liner layer in said contact openings prior to forming said conductive contacts.

10. A method, comprising:
    forming a layer of insulating material above a semiconducting substrate, said layer of insulating material having an overall thickness;
    forming a plurality of contact openings in said layer of material having said first overall thickness;
    forming an organic material such that it is formed in said contact openings and overfills said contact openings;
    after forming said organic material, performing an etching process on an entire upper surface of said layer of insulating material to reduce said overall thickness thereof such that an entire upper surface of said layer of insulating material, after the completion of said etching process, is positioned below an upper surface of said organic material remaining in at least one of said contact openings;
    after performing said etching process, removing said organic material from said contact openings; and
    forming a conductive contact in each of said contact openings.

11. The method of claim 10, further comprising, after removing said organic material from said contact openings, forming a liner layer in said contact openings prior to forming said conductive contacts.

* * * * *